(12) United States Patent
Wilson et al.

(10) Patent No.: US 8,188,787 B2
(45) Date of Patent: May 29, 2012

(54) PEAK DETECTOR FOR DETECTING PEAKS IN A MODULATED SIGNAL

(75) Inventors: Robin Wilson, Gloucestershire (GB); David Miles, Gloucestershire (GB)

(73) Assignee: Broadcom Corporation, Irvine, CA (US)

(*) Notice: Subject to any disclaimer, the term of this patent is extended or adjusted under 35 U.S.C. 154(b) by 927 days.

(21) Appl. No.: 11/883,039

(22) PCT Filed: Jan. 25, 2006

(86) PCT No.: PCT/GB2006/000254
§ 371 (c)(1),
(2), (4) Date: Jul. 25, 2007

(87) PCT Pub. No.: WO2006/079807
PCT Pub. Date: Aug. 3, 2006

(65) Prior Publication Data
US 2008/0143435 A1 Jun. 19, 2008

(30) Foreign Application Priority Data
Jan. 25, 2005 (GB) .................................. 0501593.8

(51) Int. Cl.
*H03D 1/00* (2006.01)
(52) U.S. Cl. ..................... 329/347; 340/10.1; 340/572.4
(58) Field of Classification Search .................. 329/347, 329/349; 340/10.1, 572.1, 572.4
See application file for complete search history.

(56) References Cited
U.S. PATENT DOCUMENTS
| 4,595,959 A | 6/1986 | Bailey |
| 4,637,003 A | 1/1987 | Yokogawa |
| 4,853,643 A | 8/1989 | Herleikson |
| 4,992,674 A | 2/1991 | Smith |
| 5,594,384 A | 1/1997 | Carroll et al. |
| 6,542,009 B2 | 4/2003 | Maruyama |
| 6,828,853 B2 | 12/2004 | Rizzo |

FOREIGN PATENT DOCUMENTS
| EP | 0 366 264 A | 5/1990 |
| EP | 1209869 A1 | 5/2002 |
| EP | 1377105 A2 | 1/2004 |

*Primary Examiner* — Robert J. Pascal
*Assistant Examiner* — James E Goodley
(74) *Attorney, Agent, or Firm* — Sterne, Kessler, Goldstein & Fox P.L.L.C.

(57) ABSTRACT

A demodulator for demodulating a modulated signal has a peak detector (206) with an input (100) coupled to receive the modulated signal and an output (207) to supply a peak detector output signal. The peak detector has a charge storer (314) coupled to the peak detector output so that the peak detector output signal is provided by a voltage across the charge storer (314) and a comparator (313) having a first comparator input coupled to the peak detector input to receive the modulated signal and a second comparator input coupled to the peak detector output to receive the peak detector output signal. The comparator (313) provides a comparison signal representing a comparison between the voltage of the modulated signal and the peak detector output signal. A charging controller (315, 316 and 318) charges the charge storer (314) so as to increase the output voltage when the comparator (313) provides a first signal indicating that the voltage of the modulated signal is higher than the voltage of the peak detector output signal and discharges the charge storer (314) so as to decrease the output voltage when the comparator (313) provides a second signal indicating that the voltage of the modulated signal is lower than the voltage of the peak detector output signal.

18 Claims, 4 Drawing Sheets

PEAK DETECTOR FOR DETECTING PEAKS IN A MODULATED SIGNAL

This invention relates to a demodulator for demodulating a modulated signal, in particular, but not exclusively, an RF (Radio Frequency) modulated signal. The invention has particular but not exclusive application in near field RF (radio frequency) communication in which communication occurs when an RF antenna of one near field RF communicator is inductively coupled to the alternating magnetic field (H field) resulting from a modulated RF signal generated by the RF antenna of another near field RF communicator. Such near field communication may be referred to as near-field RFID (Radio Frequency Identification) or near-field communication.

When, as in near field RF communicators and other communicators, communication occurs by modulation of a signal, then it is of course necessary for the receiving communicator to demodulate the incoming modulated signal to extract the data or information carried by the signal. Existing analogue demodulators such as diode rectifiers are sensitive to noise and the demodulation process may not be reliable if the received modulated signal is noisy (that is if the signal-to-noise ratio is not sufficiently high), and/or the carrier and sub-carrier (modulation) frequencies are close. In addition the performance of analogue demodulators can be dependent upon the precise values of circuit components so requiring low or precise tolerances on those components. Additionally, where integration is desired or required, the use of analogue demodulators may be disadvantageous because they tend to occupy a relatively large amount of the area of the integrated circuit. On the other hand, digital demodulators that first convert the analogue signal to the digital domain and then use digital signal processing methods tend to consume a large amount of power which is particularly undesirable where the demodulator is not mains-powered.

In one aspect, the present invention provides a demodulator having a peak detector having an input and an output, a comparator having first and second comparator inputs and a comparator output, a charge storer, and a charging controller, wherein the first comparator input is coupled to receive the signal to be demodulated and the second comparator input is coupled to the comparator output and the charge storer is coupled to the comparator output so that the voltage across the charge storer provides an output voltage signal at the output of the peak detector, the charging controller being operable to charge the charge storer so as to increase the output voltage when the received modulated signal is higher than the comparator output and to discharge the charge storer so as to decrease the output voltage when the received modulated signal is lower than the comparator output.

In one aspect, the present invention provides a demodulator having a peak detector having an input and an output, a comparator having first and second comparator inputs and a comparator output, a charge storer, a switch coupled so as to be controllable by the output of the comparator, a charger and a discharger, wherein the first comparator input is coupled to receive the signal to be demodulated and the second comparator input is coupled to the comparator output and the charge storer is coupled to the comparator output via the switch with, in operation, the voltage across the charge storer providing an output voltage signal at the output of the peak detector, the switch being operable to couple the charger storer to the charger when the received modulated signal is higher than the comparator output and to couple the charger storer to the discharger when the received modulated signal is lower than the comparator output.

In an embodiment, the charger comprises one of a current source and resistance coupled in series with the charge storer. In an embodiment, the discharger comprises a current source coupled in parallel with the charge storer. The charge storer is generally a capacitor or series of capacitors.

In an embodiment, a timer is provided to force the modulation envelope signal of a modulated signal to correspond to the carrier signal in the event that the comparator fails to provide an output signal for a predetermined period of time, generally a time set to be greater than one cycle of the carrier signal.

Embodiments of the present invention will now be described, by way of example, with reference to the accompanying drawings, in which.

With reference to the drawings in general, it should be understood that any functional block diagrams are intended simply to show the functionality that exists within the device and should not be taken to imply that each block shown in the functional block diagram is necessarily a discrete or separate entity. The functionality provided by a block may be discrete or may be dispersed throughout the device or throughout a part of the device. In addition, the functionality may incorporate, where appropriate, hard-wired elements, software elements or firmware elements or any combination of these. The near field RF communicator may be provided wholly or partially as an integrated circuit or collection of integrated circuits.

Figure 1:
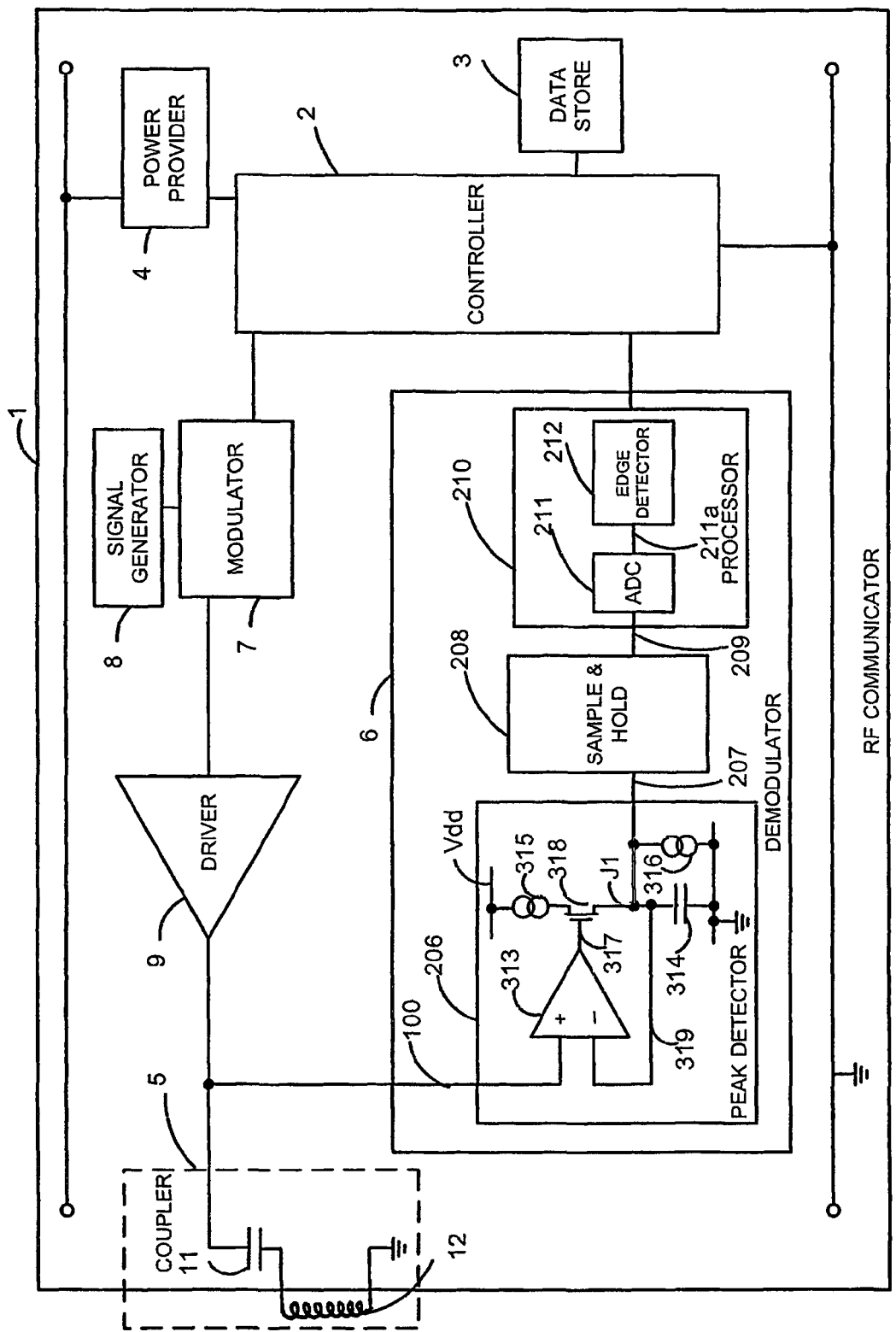
FIG. 1 shows a functional block diagram of a near field RF communicator having a demodulator embodying the invention.

Referring now specifically to FIG. 1, there is shown a functional block diagram of a near field RF communicator 1 in accordance with the invention. Near field RF communicators communicate by inductive coupling of the alternating magnetic field (H field) for example resulting from a 13.56 Mega Hertz signal generated by one of the communicators. The possible range of such inductive coupling will depend on the design of the near field RF communicator, typically the range is several centimeters but may be up to 1 meter.

The near field RF communicator 1 shown in FIG. 1 thus has an inductive coupler 5 operable to couple inductively to the inductive coupler of another in-range near field RF communicator, a demodulator 6 coupled to extract the modulation from a modulated signal inductively coupled to the inductive coupler 6 and a controller 2 associated with a data store 3 for receiving data extracted by the demodulator 6. The near field RF communicator 1 also has a power provider 4 for powering the near field RF communicator 1, although in the interests of simplicity not all of the connections to the power provider 4 are shown in FIG. 1.

The near field RF communicator 1 shown in FIG. 1 also has a signal generator 8 operable to generate an RF signal and a modulator 7 operable to modulate an RF signal under the control of the controller 2. The modulator 7 is coupled to the inductive coupler 5 via a driver 9.

As shown in FIG. 1, the inductive coupler 5 comprises a series connection to earth (ground) of a capacitor 11 and an inductor 12 formed as an antenna. As another possibility a parallel circuit configuration may be used or a combination of series and parallel circuit configurations. The exact design of the inductor and inductive coupler will depend on the functionality, range and emission standard compliance requirements, plus the environment within which the near field RF communicator 1 is designed to operate.

The modulator 7 may, for example, switch a transistor (for example a FET) coupled across the inductor 12 on and off in accordance with the data supplied by the controller 2, thereby modulating the load on the inductor 12 and thus an RF signal supplied by the near field RF communicator in accordance with that data. Alternatively or additionally modulation of an RF signal may be provided by sine synthesis (which for example may generate a PDM (Pulse Density Modulation) signal to the driver 9). As a further alternative the near field RF communicator may comprise an emulator intended to enable interference or simulated load modulation of a received RF signal as described in greater detail in WO 2005/045744, the whole contents of which are hereby incorporated by reference. In this latter case, the signal generator will be replaced by the circuitry described in WO 2005/045744 that enables interference or simulated load modulation of a received RF signal.

The controller 2 may be any suitable form of controller, for example a microprocessor, such as a RISC processor or other microprocessor, or a state machine. Program instructions for programming the controller 2 and/or control data for communication to another near field RF communicator may be stored in an internal memory of the controller and/or the data store 3. The controller 2 will also be configured to control the demodulator 6 and modulator 7.

There are different types of near field RF communicator. "NFC communicators" are capable of both initiating and responding to initiation of a near field RF communication while "initiating near field RF communicators" such as RFID transceivers or readers are capable of initiating but not of responding to initiation of near field RF communication and "responding near field RF communicators" such as RFID transponders or tags are capable of responding to initiation of but not of initiating a near field RF communication with another near field RF communicator. Examples of near field RF communicators are defined in various standards for example ISO/IEC 18092, ISO/IEC 14443, ISO/IEC 15693 ISO/IEC 21481. An NFC communicator may operate fully or partially in accordance with ISO/IEC 18092 and/or ISO/IEC 21481 while an RFID reader or RFID tag may operate fully or partially in accordance with RFID ISO/IEC 14443A or ISO/IEC 15693.

Where the near field RF communicator 1 is a responding near field RF communicator (for example an RF transponder) then it may respond by modulating a received RF signal rather than generating its own RF signal, in which case the signal generator may be omitted. Also, the near field RF communicator may or may not be self-powered, for example where the near field RF communicator 1 is a responding near field RF communicator then it may be a passive (that is not self-powered) tag or transponder which is powered only when an RF signal generated by another near field RF communicator is inductively coupled to the tag or transponder, in which case the power provider 4 will be replaced by a rectifier coupled to the inductive coupler. Where the near field RF communicator 1 is an NFC communicator then it may operate in an initiator mode (that is like an initiating near field RF communicator) or in a target mode, (that is like a responding near field RF communicator), dependent on the mode to which the NFC communicator is set. The mode may be determined by the controller 2 or may be determined in dependence on the nature of a received near field RF signal. The near field RF communicator may communicate in accordance with an active or passive protocol. When near field RF communicators communicate using an active protocol, an initiating near field RF communicator will transmit an RF field and following completion of its data communication turn off its RF field and the responding near field RF communicator will then transmit its own RF field and data before again turning off the RF field and so on. When near field RF communicators communicate using a passive protocol the initiating near field RF communicator will transmit and maintain its RF field throughout the entire communication. The protocol used will depend on instructions received from the controller 2 and the response received from a responding near field RF communicator.

The data communicated between near field RF communicators by modulation of an RF signal will depend upon the communications protocol under which the near field RF communicators are operating and the data to be communicated. Further details of possible communications protocols may be found in the above mentioned various standards for example ISO/IEC 18092, ISO/IEC 14443, ISO/IEC 15693 ISO/IEC 21481.

The near field RF communicator 1 shown in FIG. 1 may be any of the above types of near field RF communicator, in particular an NFC communicator.

A modulated signal received by the near field RF communicator 1 comprises a carrier signal and a modulation envelope signal having modulation levels (two in the case of a two level or binary modulation) resulting from the modulation of the carrier signal.

The demodulator 6 of the near field RF communicator 1 comprises a peak detector 206 operable to detect peaks in a received modulated signal on a modulated signal line 100 to provide a peak detector signal on a peak detector signal line 207 to a sample & hold circuit 208 operable with the peak detector 206 to extract a modulation envelope signal from a received modulated signal. An extracted modulation envelope signal is supplied via a modulation envelope signal line 209 to a processor 210 operable to supply to the controller 2 on a digital signal line 104 a digital signal representing the extracted modulation.

In this example, the processor 210 comprises an analogue to digital converter (ADC) 211 and an edge detector 212. The ADC 211 is operable to provide a digital representation (the digital modulation envelope signal) of the modulation envelope signal while the edge detector 212 is operable to detect edge transitions between modulation levels of the modulation envelope to provide on the digital signal line 104 a digital signal representing the extracted modulation. The edge detector 212 may perform a squelch function, that is the edge detector 212 may inhibit changes in the digital output when the modulation envelope signal is so small compared to the noise level that erroneous results may occur.

The processor 210 may be implemented in any appropriate manner (for example as analogue or digital circuitry or a combination of analogue and digital circuitry) that can provide analogue to digital conversion and edge detection functionality. For example, the edge detector 212 may be a DSP (Digital Signal Processor), or microprocessor, microcontroller, state machine or the like, with the use of a DSP being advantageous to minimise integrated circuit area in an integrated arrangement. The ADC 211 may be any suitable ADC, for example a multi-bit Sigma ADC or flash converter ADC may be used to achieve fast conversion speed while keeping the area occupied by the ADC small and its power consumption low.

As shown in FIG. 1, the peak detector 206 comprises a charge storer 314 in the form of a capacitor or series of capacitors 314 coupled directly to earth (ground) and via a series connection of the main current path of a switch 318 and a charger 315 to a voltage supply line Vdd (although not shown in FIG. 1, the voltage supply line Vdd and earth will of course be derived from the output of the power provider 4). A control input or gate of the switch 318 is coupled to the output of a comparator 313 having its positive input coupled to the modulated signal supply line 100 and its negative input coupled to a junction J1 which is itself coupled to the peak detector signal line 207 so that the voltage at the charge storer 314 provides the output voltage on the peak detector signal line 207. The output of the comparator 317 is thus coupled to its negative input via the switch 318.

In the example shown in FIG. 1, the charger 315 and discharger 316 comprise, respectively, relatively strong and relatively weak current sources, although the strong current source may be replaced by a relatively high value resistance (for example resistor of several mega Ohms) which may be at least one of a separate component and the inherent or internal resistance of the switch 318, depending upon the type of switch used. The discharger 316 may also be a resistor. In the example illustrated, the switch comprises a Field Effect Transistor such as an IGFET (Insulated Gate Field Effect Transistor), although other forms or combinations of three terminal semiconductor switches may be used. Any suitable form of current source may be used, for example a Field Effect Transistor (FET).

The central part of the peak detector is the charge storer 314. In operation of the peak detector 206, when the voltage of the modulated carrier signal on the modulated carrier signal line 100 is greater than the voltage of the peak detector signal 317 at the output of the comparator 313 and thus on the peak detector output line 207, the comparator 313 renders the switch 318 conducting so coupling the charge storer 314 to the charger 315. The charger 315 is configured to charge the charge storer 314 more quickly than the charge storer 314 can be discharged by the discharger 316 (for example as described above the charger 315 may be a relatively strong current source or high value resistor while the discharger 316 is a relatively weak current source) so that in operation, when the charger 315 is coupled to the charge storer 314 by the switch 318, the charge storer 314 is rapidly charged raising the output voltage at J1. However, when the voltage of the modulated carrier signal on the modulated carrier signal line 100 is equal to or less than the voltage of the peak detector signal, the comparator 313 renders the switch 318 non-conducting thereby disconnecting the charge storer 314 from the charger 315 and allowing the charge storer 314 to be discharged slowly via the discharger 316 coupled across it.

Other forms of charger and discharger may be used, it being required in each case, where as shown the discharger 316 is always coupled across the charge storer 314, that the discharger 316 causes discharging to occur much more slowly than charging is effected by the charger 315 so that the charger 315 can charge up the charge storer 314 when coupled to the charge storer 314 by the switch 318. As another possibility, the switch 318 may be configured so that, when the voltage of the modulated carrier signal on the modulated carrier signal line 100 is greater than the voltage of the peak detector signal, the charger 315 is coupled to the charge storer 314 and the discharger 316 is disconnected from the charge storer 314 so that no discharging occurs during charging while, when the voltage of the modulated carrier signal on the modulated carrier signal line 100 is less than the voltage of the peak detector signal, the charger 315 is disconnected from the charge storer 314 and the discharger 316 is coupled to the charge storer 314. In this case, it is not necessary for the charger to charge the charge storer more rapidly than the discharger.

Figure 2:
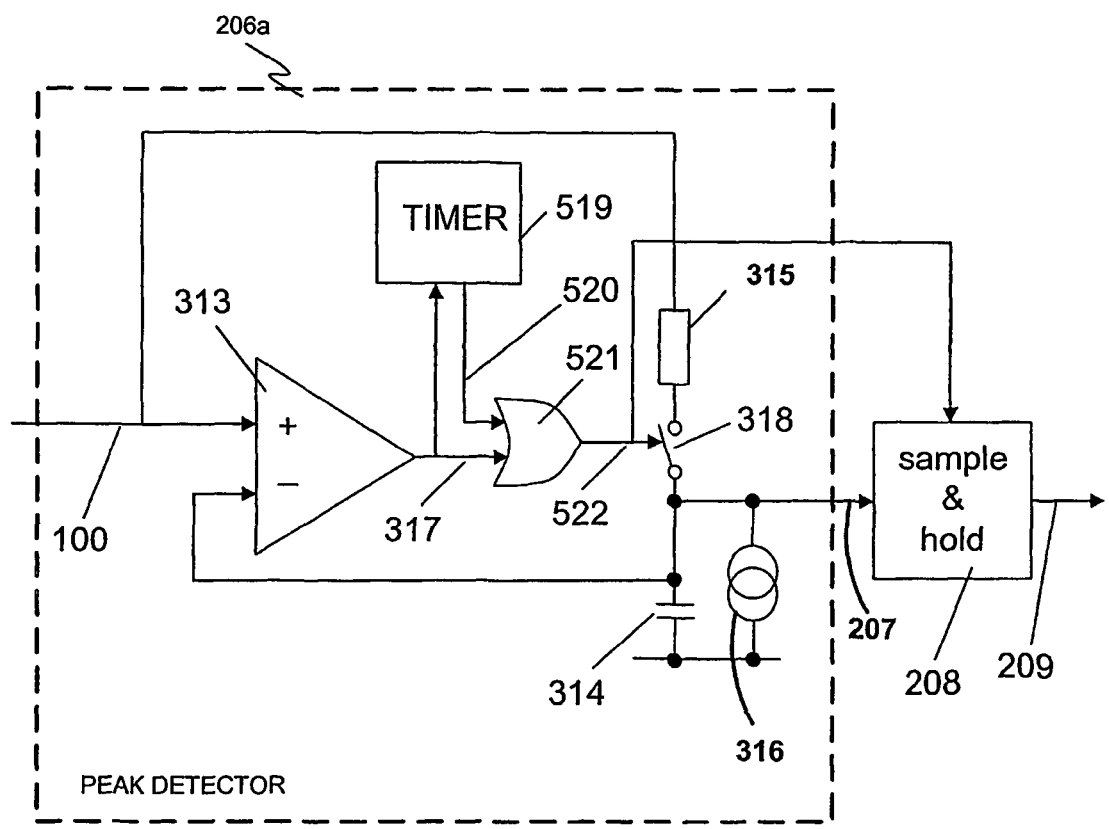
FIG. 2 shows a functional block diagram of one example of a peak detector of a demodulator embodying the invention.

FIG. 2 shows another form of peak detector suitable for a demodulator embodying the invention. The peak detector 206a shown in FIG. 2 differs from that shown in FIG. 1 and described above in that the output 317 of the comparator 313 is not coupled directly to the control input of the switch 318 but rather is coupled to one input of an OR gate 521 and also to a timer 519 which has its output 520 coupled to the other input of the OR gate 521. Any suitable form of timer may be used for the timer 519, for example monostable or clocked flip-flops.

The output of the OR gate 521 is coupled to the control input of the switch 318 and also to a control input of the sample & hold circuit 208 so that a high output from the OR gate 521 renders the switch 318 conducting (closes the switch) and activates the sample & hold circuit 208.

The timer 519 has a counter which is reset when the output of the comparator 313 is high, that is when the voltage of the modulated carrier signal on the modulated carrier signal line 100 is greater than the voltage of the peak detector signal at the output junction J1. The timer 519 is configured to provide a high output "time out" signal on line 520 to the OR gate 521 when a predetermined time has elapsed since the counter was last reset by a high output from the comparator 313. The predetermined time is preferably set to be equal to a number of cycle times or periods of the RF carrier frequency. If the comparator 313 provides a high output signal on line 317 within the predetermined time period, then the timer 519 will not provide a high output signal on line 520. However if the comparator 313 fails to provide a high output signal on line 317 by the end of the predetermined period of time, the timer 519 will time out and provide a replacement high output signal to the OR gate 521 to force the switch 318 to be rendered conducting to cause the charge storer 314 to be charged up to a voltage representing the level of the modulated carrier signal, thereby setting the modulation envelope signal on line 209 to the level of the modulated carrier signal.

In addition to the above-mentioned differences from the peak detector 206 shown in FIG. 1, FIG. 2 also shows the charger 315a as a high-value resistance which may be provided by at least one of a separate component and the inherent or internal resistance of the switch 318. Of course, a current source could be used as the charger 315a as in the example shown in FIG. 1.

The peak detector 206a shown in FIG. 2 has the advantage over the peak detector 206 shown in FIG. 1 of coping with modulated signals where the modulation depth is so high and thus the modulated carrier pulses signal level so low that the charge storer 314 is not discharged sufficiently when the switch 318 is open (non-conducting), causing the output of the comparator (and thus its negative input) to remain so high that upon the next carrier pulse the output of the comparator remains low and the sample & hold circuit 208 maintains its previous value. The predetermined time out period of the timer 519 ensures that the comparator output is forced high at the end of the predetermined period and so avoids potentially missing the whole of the modulated carrier interval in error where the modulation depth is high.

Figure 4:
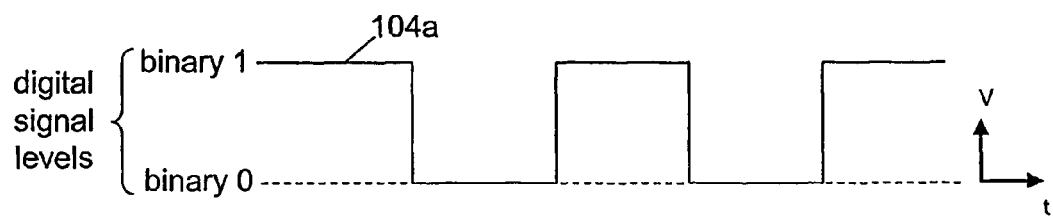
Figure 5:
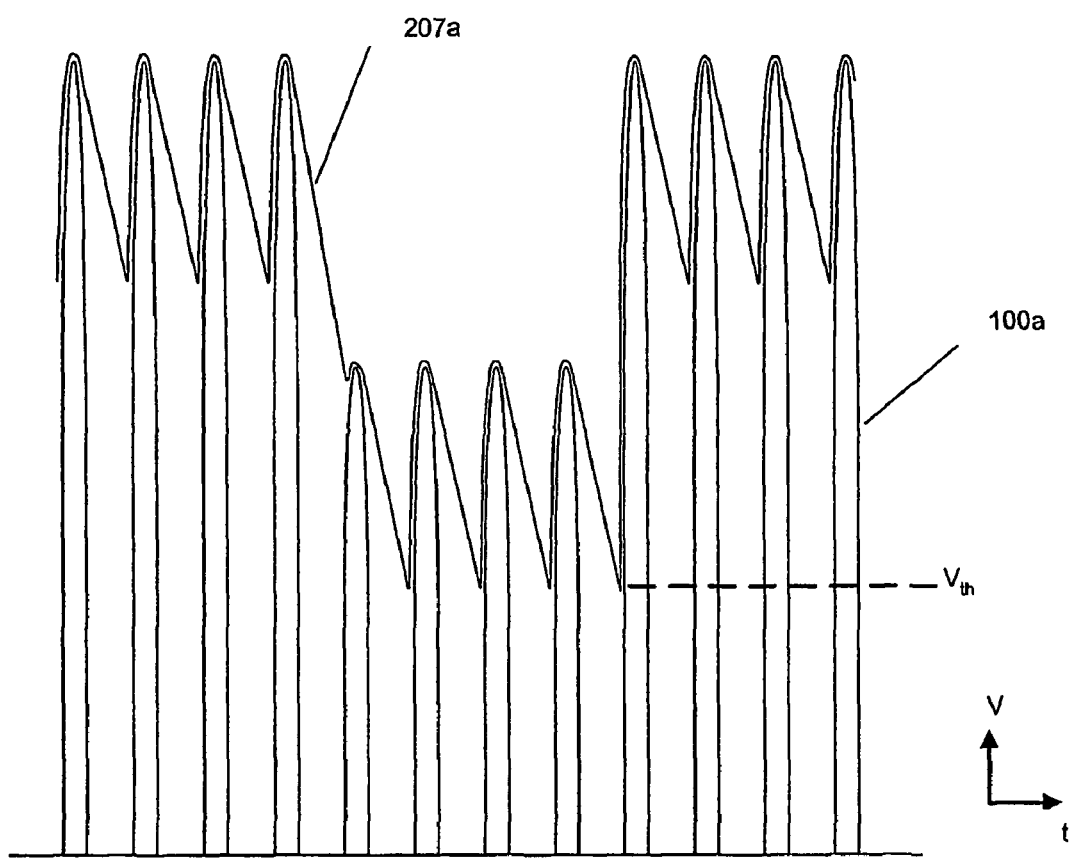
FIG. 5 shows a graph illustrating the relationship between the input waveform or signal and the output waveform or signal of a peak detector of a demodulator embodying the invention.

Operation of the demodulator described above will now be explained with the aid of the wave forms or graphs shown in FIGS. 3 to 5 in which the vertical axis represents signal voltage V and the horizontal axis represents time t.

Figure 3:
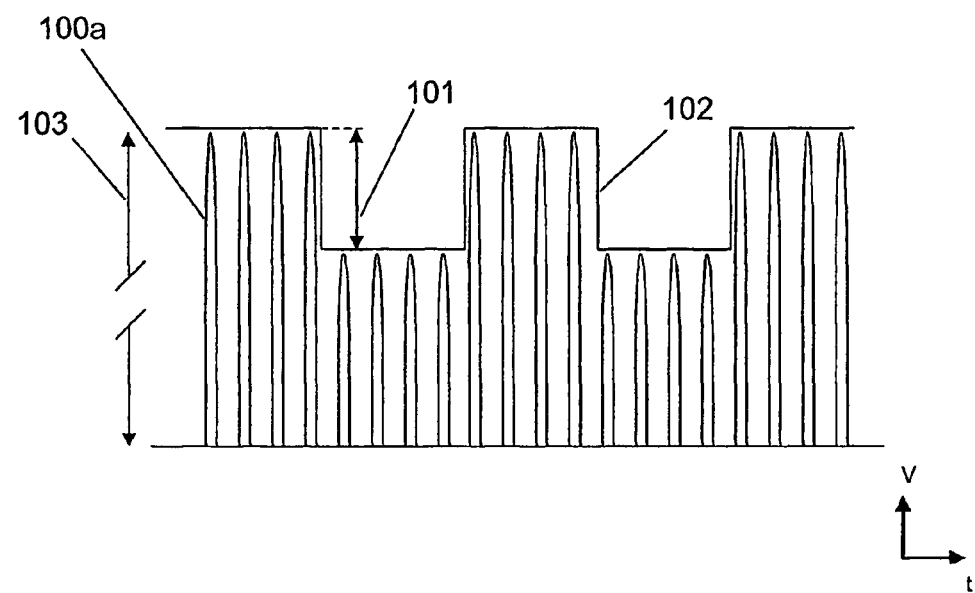
FIGS. 3 and 4 show graphs representing, respectively, an example of a modulated input signal that may be supplied to a demodulator embodying the invention and a corresponding idealized digital output signal.

FIG. 3 shows an example of an AM (Amplitude Modulated) or ASK (Amplitude Shift KEY) modulated signal 100a. This modulated signal 100a has a carrier amplitude 103 and modulation depth 101 and may be generated by a near field RF communicator as described above, for example by an RFID reader or NFC communicator. The square wave labelled 102 in FIG. 4a represents the idealized modulation envelope signal 102. FIG. 4 shows the digital output 104a corresponding to the idealized modulation envelope signal 102 in which the high signal level represents a binary 1 and the low signal level represents a binary zero. As will be appreciated by those skilled in the art, in practice such an idealised modulation envelope signal 102 is unlikely to be achieved.

The peak detector 206 or 206a described above processes the received modulated signal, for example the signal shown in FIG. 3, to identify the peaks, that is to identify the portions of the modulated signal that exceed a threshold voltage value $V_{th}$ determined by the peak detector 206 or 206a. FIG. 5 shows a graph illustrating the relationship between an example of a modulated input signal 100a (shown in dashed lines) received by the peak detector 206 or 206a on input line 100 and the corresponding output signal 207a supplied by the peak detector 206 or 206a on output line 207 and representing that part of the modulated input signal exceeding the threshold value. The function of the peak detector is thus to remove the carrier signal component.

The sample & hold circuit 208 receives the peak detector signal 207 from the peak detector 206 or 206a and provides a modulation envelope signal to the ADC 211 which produces a digital representation (the digital modulation envelope signal) of the modulation envelope signal. The edge detector 212 detects edge transitions between modulation levels of the digital modulation envelope signal and provides on the digital signal line 104 a digital signal representing the extracted modulation. As set out above, the edge detector 212 may perform a squelch function to inhibit changes in the digital output when the modulation envelope signal is so small compared to the noise level that erroneous results may occur.

The peak detector 206 or 206a described above is able rapidly to track changes in carrier amplitude under difficult circumstances, such as when the modulation depth 101 may be as small as 30 mV and where the carrier amplitude 103 may be several volts and also varying in amplitude. Unlike conventional pn junction diode-rectifier based demodulators, the peak detector 206 or 206a can be implemented in a CMOS process and there is no voltage drop between input and output, hence the output is more representative of the received signal.

Additional processing may be provided by the demodulator 6 prior to the peak detector, for example, a synchronous detector may, as is well known to persons skilled in the art, be provided to improve rejection of noise and improve rejection of signal distortions.

The demodulator has been described above as for use in a near field RF communicator. Such a near field RF communicator may be provided as standalone or discrete devices or may be incorporated within or coupled to larger electrical devices or host devices to enable those devices to communicate by the near field with other near field RF communicators or devices incorporating or coupled to such near field RF communicators. When incorporated within a larger device or host, a near field RF communicator may be a discrete entity or may be provided by or incorporated within functionality within the larger device or host. Examples of such larger devices or host devices are, for example, mobile telephones, portable computing devices (such as personal digital assistants, notebooks, lap-tops), other computing devices such as personal or desk top computers, computer peripherals such as printers, or other electrical devices such as portable audio and/or video players such as MP3 players, IPODs®, CD players, DVD players. Also, rather than being incorporated within the host device, a near field RF communicator may be associated with the host device, for example by a wired or wireless coupling that is capable of power transfer. In such a case, the near field RF communicator may be physically separate from or may be attached to the housing of the host device; in the later case, the attachment may be permanent once made or the near field RF communicator may be removable. For example, the near field RF communicator may be housed within: a housing attachable to another device; a housing portion, such as a fascia of a near field RF communications enabled device or an other device; an access card; or may have a housing shaped or configured to look like a smart card. For example an near field RF communicator may be coupled to a larger device by way of a communications link such as, for example, a USB link, or may be provided as a card (for example a PCMCIA card or a card that looks like a smart card) which can be received in an appropriate slot of the larger or host device.

The functionality of the processor 210 is shown as being within the demodulator 6. At least some of the functionality of the processor 210 may be provided externally of the demodulator, for example by the controller 2. Similarly, although the functionality of the controller 2 is shown in FIG. 1 as being entirely within the near field RF communicator, the controller functionality may be entirely within any host device controller or distributed between the demodulator, near field RF communicator and the host device. As a further possibility, certain control functionality may reside within a separate unit which is attachable or removable or alternatively only used for certain transactions, for example a security device or ESD device which may only be used for payment transactions. Where the functionality of the controller 2 is within a separate unit or within any host device, then instead of the controller 2 the near field RF communicator will have a coupling, possibly including an appropriate interface, to that controller.

In the embodiments described above, the demodulator comprises a demodulator suitable for and incorporated in a near field RF communicator. A demodulator embodying the invention may however be used in another forms of communicators and any other suitable apparatus, device or system that requires a demodulator. A demodulator embodying the invention may be comprised within a self-contained circuit or unit within a larger device such as a near field RF communicator or may be comprised of multiple functional units or blocks achieving the same functionality. The circuit or circuit blocks may be shared between the demodulator and the larger device or other functionality within the larger device or functionality.

The carrier of the signal to be demodulated signal may be of any suitable frequency, for example 13.56 MHz as mentioned above for near field RF communicators. The maximum carrier frequency is only restricted by the characteristics of the circuit components and the current available to the circuit, and for example when using commonly-available CMOS integrated circuit processes, the maximum frequency may be in the region of several 100 MHz. The modulation of the carrier signal may represent any form of data, for example control data, identification data, communication data or information on a larger device.

It should of course be understood that the polarities given above may be reversed so that, for example, a low signal represents a binary one and a high signal a binary zero. Also, the demodulator may be configured so that the various outputs, for example of the comparators, are of opposite polarity to that described above.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A peak detector for detecting peaks in a modulated signal, comprising:
   a charge storer configured to provide a peak detector output signal, the peak detector output signal indicative of the peaks in the modulated signal;
   a comparator configured to compare the modulated signal and the peak detector output signal to provide a comparison signal, the comparison signal being a first voltage level indicating that the modulated signal is greater than the peak detector output signal or a second voltage level indicating that the modulated signal is less than the peak detector output signal; and
   a charging controller configured to continuously provide a first current to the charge storer so as to decrease the peak detector output signal and to provide a second current to the charge storer when the comparison signal is at the first voltage level, the second current being greater than the first current such that a combination of the first current and the second current is able to charge the charge storer.

2. The peak detector of claim 1, wherein the charging controller comprises:
   a discharger, coupled to the charge storer, configured to provide the first current;
   a charger configured to provide the second current; and
   a coupler configured to couple the charger to the charge storer to charge the charge storer when the comparison signal is at the first voltage level and to decouple the charger from the charge storer to discharge the charge storer when the comparison signal is at the second voltage level.

3. The peak detector of claim 2, wherein the second current is able to charge the charge storer more quickly than the first current is able to discharge the charge storer.

4. The peak detector of claim 2, wherein the coupler comprises:
   a semiconductor switch.

5. The peak detector of claim 2, wherein the discharger and the charger is a current source or a resistance.

6. The peak detector of claim 2, wherein the charger is a current source or a resistance.

7. The peak detector of claim 2, wherein the discharger comprises:
   a weak current source in relation to the charger.

8. The peak detector of claim 1, wherein the discharger comprises a resistor and the charger comprises:
   a Field Effect Transistor.

9. The peak detector of claim 1, wherein the charge storer comprises:
   at least one capacitor.

10. The peak detector of claim 1, wherein the peak detector is implemented as part of a NFC Communicator.

11. A peak detector for detecting peaks in a modulated signal, comprising:
    means for storing a peak detector output signal, the peak detector output signal indicative of the peaks in the modulated signal;
    means for comparing the modulated signal and the peak detector output signal to provide a comparison signal, the comparison signal being a first voltage level indicating that the modulated signal is greater than the peak detector output signal or a second voltage level indicating that the modulated signal is less than the peak detector output signal; and
    means for controlling the peak detector output signal by continuously providing a first current to the means for storing so as to decrease the peak detector output signal and by providing a second current to the means for storing when the comparison signal is at the first voltage level, the charging of the means for storing the peak detector output signal being greater than the discharging of the means for storing the peak detector output signal.

12. The peak detector of claim 11, wherein the means for controlling the peak detector output signal comprises:
    means for decreasing the peak detector output signal using the first current;
    means for increasing the peak detector output signal using the second current;
    means for coupling the means for increasing the peak detector output signal to the means for storing the peak detector output signal to increase the peak detector output signal when the comparison signal is at the first voltage level and for decoupling the means for increasing the peak detector output signal from the means for storing the peak detector output signal to decrease the peak detector output signal when the comparison signal is at the second voltage level; and
    second means for coupling the means for increasing the peak detector output signal to the means for storing the peak detector output signal upon expiration of a predetermined time period which has elapsed since the comparison signal was at the first voltage level.

13. A peak detector, comprising:
    a charge storer configured to provide a peak detector output signal;
    a comparator configured to compare a modulated signal and the peak detector output signal to provide a comparison signal, the comparison signal being a first voltage level indicating that the modulated signal is greater than the peak detector output signal or a second voltage level indicating that the modulated signal is less than the peak detector output signal, the first voltage level being greater than the second voltage level;
    a timer configured to output a replacement signal being a third voltage level upon expiration of a pre-determined time period which has elapsed since the comparison signal was at the first voltage level; and
    a charging controller configured to charge the charge storer so as to increase the peak detector output signal when the comparison signal is at the first voltage level or the replacement signal is at the third voltage level, and to discharge the charge storer so as to decrease the peak detector output signal when the comparison signal is at the second voltage level.

14. The peak detector of claim 13, wherein the third voltage level is substantially equal to the first voltage level.

15. The peak detector of claim 14, wherein the charging controller comprises:
    a charger configured to provide a first current;

a discharger, coupled to the charge storer, configured to provide a second current, the first current being greater than the second current;

a logic gate configured to receive the comparison signal and the replacement signal and to output a logic gate signal, the logic gate signal being a fourth voltage level that is substantially equal to the first voltage level, when the comparison signal is at the first voltage level or the replacement signal is at the third voltage level, or a fifth voltage level that is substantially equal to the second voltage level, when the comparison signal is at the second voltage level; and a coupler configured to couple the charger to the charge storer so as to increase the peak detector output signal when the logic gate signal is at the fourth voltage level and to decouple the charger from the charge storer so as to decrease the peak detector output signal when the logic gate signal is at the fifth voltage level.

16. The peak detector of claim 14, wherein the first current is configured to charge the charge storer more quickly than the second current is able to discharge the charge storer.

17. The peak detector of claim 13, wherein the timer is configured to increment a counter value and to output the replacement signal at the third voltage level when the counter value is substantially equal to the pre-determined time period.

18. The peak detector of claim 17, wherein the timer is further configured to reset the counter value when the comparison signal is at the first voltage level.

* * * * *